United States Patent [19]

Osada et al.

[11] 4,058,398
[45] Nov. 15, 1977

[54] IMAGE RECORDING MATERIAL AND METHOD FOR FORMING AN IMAGE USING THE SAME

[75] Inventors: Chiaki Osada, Odawara; Eiichi Hasegawa; Masataka Murata, both of Asaka, all of Japan

[73] Assignee: Fuji Photo Film Co., Ltd., Minami-ashigara, Japan

[21] Appl. No.: 617,603

[22] Filed: Sept. 29, 1975

[30] Foreign Application Priority Data

Sept. 27, 1974 Japan ............................... 49-111171

[51] Int. Cl.$^2$ .......................... G03C 5/08; G03C 1/68
[52] U.S. Cl. ....................................... 96/27 R; 96/33; 96/35.1; 96/36.2; 96/115 P; 96/83; 96/86 P
[58] Field of Search ....................... 96/115, 35.1, 86 P, 96/33, 36.2, 83

[56] References Cited
U.S. PATENT DOCUMENTS 3,870,524  3/1975  Watanabe et al. ................. 96/115 P Primary Examiner—John D. Welsh
Attorney, Agent, or Firm—Sughrue, Rothwell, Mion, Zinn and Macpeak

[57] ABSTRACT

A recording material comprising a support, a layer of a light-sensitive composition on the support, and a transparent film on the layer of the light-sensitive composition wherein the light-sensitive composition comprises (a) a monomer containing at least two addition polymerizable unsaturated bonds and having a boiling point of at least 100° C, (b) polyvinyl butyral, and (c) a photopolymerization initiator represented by the formula:

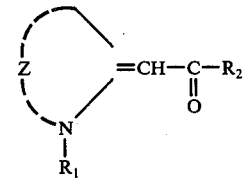

wherein $R_1$ is an alkyl group which may be substituted or a vinyl-methyl group, $R_2$ is an alkyl group, aryl group, or thienyl group, and Z is a group of non-metallic atoms required for forming a heterocyclic ring.

After the recording material is imagewise exposed to light, the transparent film is peeled off while heating at about 70° to 150° C, whereby a positive or negative image is formed on each of the support and transparent film.

18 Claims, No Drawings

IMAGE RECORDING MATERIAL AND METHOD FOR FORMING AN IMAGE USING THE SAME

BACKGROUND OF THE INVENTION

1. Field of the Invention

The present invention relates to an image forming material and an image forming method, particularly, the present invention relates to an image forming material and a method of forming an image therewith by a dry process in which a photopolymerizable composition is used.

2. Description of the Prior Art

Heretofore, as photoresist materials for producing printed circuits, often solution development type recording materials such as a light-sensitive solution in which a dichromate is used in combination with glue, polyvinyl alcohol and the like, a light-sensitive solution mainly composed of polyvinyl cinnamate and a sensitizer and a light-sensitive solution mainly composed of natural rubber or synthetic rubber and a crosslinking agent, etc., have been used.

Further, a recording material is known in which a light-sensitive layer is interposed between two plastic films. In this case, one of the plastic films is peeled off to expose the light-sensitive layer and the recording material is laminated onto the metal which is to form the printed circuit, typically copper, in such a manner that the light-sensitive layer comes in contact with the area which the printed circuit is to be formed. The recording material thus laminated is imagewise exposed to light through the other plastic film and, after removal of the other plastic film, is developed with a developing solution such as an organic solvent, an alkali aqueous solution or the like. The areas where the light-sensitive layer has been cured by irradiation remain on the copper plate, whereas the areas where the light-sensitive layer has not been cured are dissolved in the developing solution and removed. In this way, the desired resist pattern for the printed circuit is produced.

However, the above described solution development type of recording materials are complicated in use in that a developing solution must be used and, furthermore, the use of a developing solution is not desired in that it often leads to environmental pollution.

Recently, in place of such solution development type recording materials, recording materials have been proposed in which dry development is possible. For example, U.S. Pat. Nos. 2,951,758 and 3,060,023 describe a method of forming an image in which the difference in adhesion strength to the support between exposed areas and unexposed areas at a heating temperature of about 40° to 220° C is utilized. In accordance with this method, a layer of a photopolymerizable composition mainly composed of a polymer (as a binder), an unsaturated monomer and an initiator for photopolymerization is provided on a support such as a plastic film, a metal plate, paper and the like, and a thin transparent film is provided on the photopolymerizable composition layer. Imagewise exposure is applied from above the thin transparent film, and then the thin transparent film is peeled off, whereby exposed areas and unexposed areas of the light-sensitive layer on the support of transparent film are selectively removed to give negative and positive images (or positive and negative images) on the support and transparent film, respectively.

In the case of using such a recording material, development using a liquid is omitted, and a resist pattern is formed merely by peeling off the transparent film. A great deal of labor is saved in producing printed circuits using this method.

In accordance with this method, since the combination of (a) an unsaturated monomer, (b) a binder, and (c) a photopolymerization initiator determines the sensitivity, the characteristics of the images obtained and the like, various combinations have been proposed. However, no light-sensitive composition having completely satisfactory properties has been discovered until the present invention.

SUMMARY OF THE INVENTION

As a result of various investigations, it has been found that the above image forming method can be markedly improved by using polyvinyl butyral as a binder in combination with a photopolymerization initiator represented by the formula:

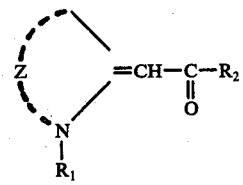

wherein $R_1$ is an alkyl group, which may be substituted, or a vinylmethyl group, $R_2$ is an alkyl group, aryl group, or thienyl group, and Z is a group of non-metallic atoms required for forming a heterocyclic ring.

The present invention provides a method of forming an image which comprises imagewise exposing a recording material comprising a support, a light-sensitive composition layer on the support, and a transparent film on the light-sensitive composition layer, and then peeling off the transparent film, wherein the light-sensitive composition comprises (a) a monomer containing at least two addition polymerizable unsaturated bonds and having a boiling point of 100° C or higher, (b) polyvinyl butyral, and (c) a photopolymerization initiator represented by the formula:

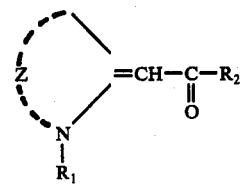

wherein $R_1$ is an alkyl group, which may be substituted or a vinylmethyl group, $R_2$ is an alkyl group, aryl group, or thienyl group, and Z is a group of non-metallic atoms required for forming a heterocyclic ring.

DETAILED DESCRIPTION OF THE INVENTION

As Component (a) in the light-sensitive composition used in the present invention, any monomer or combination of monomers containing at least two addition polymerizable unsaturated bonds and having a boiling point of at least 100° C can be used.

Compounds containing two or more addition polymerizable unsaturated bonds and having a boiling point of at least 100° C which are most prefered include those set out below:

acrylates and methacrylates, polyacrylates and polymethacrylates of polyvalent alcohols, most preferably with 2 to 100 carbon atoms and 2 to 8 alcohol (hydroxy) groups (the term "polyacrylates" means diacrylates, triacrylates and higher acrylates). As the above polyvalent alcohol, the following are preferably used: polyethylene glycol, polypropylene oxide, polybutylene oxide, polycyclohexene oxide, poly(ethylenepropylene)oxide, polystyrene oxide, polyoxetane, polytetrahydrofuran, cyclohexane diol, xylylene diol, di($\beta$-hydroxyethoxy)-benzene, glycerin, diglycerin, neopentylglycol, trimethylolpropane, triethylolpropane, pentaerythritol, dipentaerythritol, sorbitan, sorbitol, butanediol, butanetriol, 2-butene-1,4-diol, 2-n-butyl-2-ethyl-propanediol, 2-butyne-1,4-diol, 3-chloro-1,2-propanediol, 1,4-cyclohexanedimethanol, 3-cyclohexene-1,1-dimethanol, decalindiol, 2,3-dibromo-2-butene-1,4-diol, 2,2-diethyl-1,3-propanediol, 1,5-dihydroxy-1,2,3,4-tetrahydronaphthalene, 2,5-dimethyl-2,5-hexanediol, 2,2-dimethyl-1,3-propanediol, 2,2-diphenyl-1,3-propanediol, dodecanediol, mesoerythritol, 2-ethyl-1,3-hexanediol, 2-ethyl-2-(hydroxymethyl)-1,3-2-ethyl-2-methyl-1,3-propanediol, heptanediol, hexanediol, 3-hexene-2,5-diol, hydroxybenzyl alcohol, hydroxyethyl resorcinol, 2-ethyl-1,4-butanediol, 2-methyl-2,4-pentanediol, nonanediol, octanediol, pentanediol, 1-phenyl-1,2-ethanediol, propanediol, 2,2,4,4-tetramethyl-1,3-cyclobutanediol, 2,3,5,6-tetramethyl-p-xylene-$\alpha,\alpha'$-diol, 1,1,4,4-tetraphenyl-1,4-butanediol, 1,1,4,4-tetraphenyl-2-butyne-1,4-diol, 1,2,6-trihydroxyhexane, 1,1'-bi-2-naphthol, dihydroxynaphthalene, 1,1'-methylene-di-2-naphthol, 1,2,4-benzenetriol, bisphenol, 2,2'-bis(4-hydroxyphenyl)butane, 1,1-bis(4-hydroxyphenyl)cyclohexane, bis(hydroxyphenyl)methane, catechol, 4-chlororesorcinol, 3,4-dihydroxyhydrocinnamic acid, hydroquinone, hydroxybenzyl alcohol, methylhydroquinone, methyl-2,4,6-trihydroxybenzoate, pyrogallol, resorcinol, glucose, $\alpha$-(1-aminoethyl)-p-hydroxybenzyl alcohol, 2-amino-2-ethyl-1,3-propanediol, 2-amino-2-methyl-1,3-propanediol, 3-amino-1,2-propanediol, N-(3-aminopropyl)-diethanolamine, N,N'-bis(2-hydroxyethyl)piperazine, 2,2-bis(hydroxymethyl)-2,2',2"-nitrilstriethanol, 2,2-bis(hydroxymethyl)propionic acid, 1,3-bis(hydroxymethyl)urea, 1,2-bis(4-pyridyl)-1,2-ethanediol, N-n-butyldiethanolamine, diethanolamine, N-ethyldiethanolamine, 3-mercapto-1,2-propanediol, 3-piperidino1,2-propanediol, 2-(2-pyridyl)-1,3-propanediol, triethanolamine, $\alpha$-(1-aminoethyl)-p-hydroxybenzyl alcohol, 3-amino-4-hydroxyphenyl sulfone, and the like.

Of these compounds, the most preferred ones are, from the view point of the ease of obtaining the same, ethylene glycol diacrylate, diethylene glycol dimethacrylate, polyethylene glycol diacrylate, pentaerythritol triacrylate, pentaerythritol dimethacrylate, dipentaerythritol pentaacrylate, glycerin triacrylate, didiglycerin dimethacrylate, 1,3-propanediol diacrylate, 1,2,4-butanetriol trimethacrylate, 1,4-cyclohexanediol diacrylate, 1,5-pentanediol diacrylate, neopentylglycol diacrylate, the triacrylate of a 1:1 ethylene oxide-trimethylolpropane adduct and the like.

As acrylamides and methacrylamides, in addition to methylenebisacrylamide and methylenebismethacrylamide, polyacrylamides and polymethacrylamides of ethylenediamine, diaminopropane, diaminobutane, pentamethylenediamine, hexamethylene bis(2-aminopropyl)amine, diethylenetriaminediamine, heptamethylenediamine, octamethylenediamine, and polyamines comprising one or more, e.g., one to four, benzene groups, e.g., phenylenediamine, xylylenediamine, $\beta$-(4-aminophenyl)ethylamine, diaminobenzoic acid, diaminotoluene, diaminoanthraquinone, diaminofluorene and the like can be used.

As allyl compounds, diallyl esters of dicarboxylic acids such as phthalic acid, terephthalic acid, sebacic acid, adipic acid, glutaric acid, malonic acid, oxalic acid, and the like, preferably dicarboxylic acids with 2 to 20 carbon atoms, are used.

Of these monomers containing two or more addition polymerizable unsaturated bonds and a boiling point of at least 100° C, preferred are acrylates and methacrylates.

These addition polymerizable unsaturated bond-containing monomers can be used as mixtures thereof, if desired.

On the other hand, the binder (b) used in the present invention, polyvinyl butyral, is a polymeric compound obtained by reacting polyvinyl alcohol with butyraldehyde. The polyvinyl butyral used in the present invention has a molecular weight of from about 10,000 to about 1,000,000, preferably from about 20,000 to 100,000. A suitable degree of butyralation is from about 58 to about 75 mole %, with a preferred range being from about 70 to about 75 mole %. Moreover, those polyvinyl butyrals acetylated to an extent of not more than about 10 mole % can be used in the present invention. The above polyvinyl butyrals can be used in admixtures comprising two or more thereof, and are used in an amount of about 50 to 300 parts by weight, preferably about 100 to 200 parts by weight, per 100 parts by weight of Component (a).

As the photopolymerization initiator(s) used in the present invention, those compounds represented by the following formula can be used.

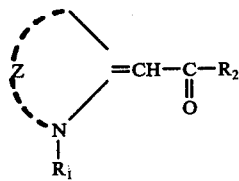

In the above formula, $R_1$ can be an alkyl group as is commonly used in the cyanine dye art, for example, an unsubstituted alkyl group, e.g., methyl, ethyl, propyl, or the like, or a substituted alkyl group such as a hydroxyalkyl group, e.g., 2-hydroxyethyl or the like, an alkoxyalkyl group, e.g., 2-methoxyethyl or the like, a carboxyalkyl group, e.g., carboxymethyl, 2-carboxyethyl or the like, a sulfoalkyl group, e.g., 2-sulfoethyl, 3-sulfopropyl or the like, an aralkyl group having a mono- or biaryl ring in the aryl moiety thereof and preferably an alkyl moiety having 1 to 5 carbon atoms, e.g., benzyl, phenethyl, p-sulfophenethyl, p-carboxyphenethyl or the like, a vinylmethyl group or the like; preferred alkyl groups are those with 1 to 10 carbon atoms, and most preferred are methyl, ethyl and propyl groups.

$R_2$ is an alkyl group, preferably an alkyl group having 1 to 10 carbon atoms, e.g., methyl, ethyl, propyl or the like, an aryl group comprising one to three fused rings, preferably phenyl, p-hydroxyphenyl, p-methoxyphenyl, p-chlorophenyl, naphthyl, anthryl, phenanthryl or the like, or a thienyl group.

Z is a group of non-metallic atoms, such as O, Se, S, etc., required for forming a nitrogen-containing heterocyclic nucleus as is conventionally used in the cyanine dye art, preferably a nitrogen-containing 5-membered ring which is fused with a system containing 6-membered rings, e.g., benzene rings, to form a condensed ring, for example, those represented by the formula

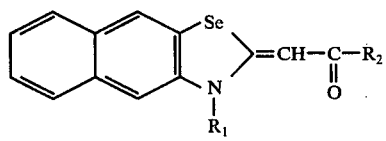

such as a benzothiazole, e.g., benzothiazole, 5-chlorobenzothiazole, 6-chlorobenzothiazole, 4-methylbenzothiazole, 6-methylbenzothiazole, 5-phenylbenzothiazole, 6-methoxybenzothiazole, 4-ethoxybenzothiazole, 5-methoxybenzothiazole, 5-hydroxybenzothiazole, 5,6-dimethylbenzothiazole, 5,6-dimethoxybenzothiazole and the like, a naphthothiazole, e.g., α-naphthothiazole, β-naphthothiazole and the like, a benzoselenazole, e.g., benzoselenazole, 5-chlorobenzoselenazole, 6-methylbenzoselenazole, 6-methoxybenzoselenazole and the like, a naphthoselenazole, e.g., α-naphthoselenazole, β-naphthoselenazole and the like, a benzooxazole, e.g., benzooxazole, 5-methylbenzooxazole, 5-phenylbenzooxazole, 6-methoxybenzooxazole and the like, and a naphthooxazole, e.g., α-naphthooxazole, β-naphthooxazole and the like.

Representative examples of compounds represented by the above formula are 2-benzoylmethylene-3-methyl-β-naphthothiazoline, 2-benzoylmethylene-3-ethyl-β-naphthothiazoline,3-ethyl-2-(2-thenoyl)methylene-β-naphthothiazoline, 3-ethyl-2-propionylmethylene-β-naphthothiazoline, 5-chloro-3-ethyl-2-p-methoxybenzoylmethylenebenzothiazoline and the like.

The photopolymerization initiators can be used in admixtures comprising two or more thereof. They are used in an amount of about 0.1 to 20 parts by weight, preferably about 1 to 10 parts by weight, per 100 parts by weight of the monomer.

It is preferred that the photopolymerizable composition of the present invention further contain a conventional heat-polymerization inhibitor. Suitable examples of such heat-polymerization inhibitors are paramethoxy phenol, hydroquinone, t-butyl catechol, pyrolgallol, cuprous chloride, phenothiazine, chloranyl, naphthylamine, β-naphthol, 2,6-di-tert-butyl-p-cresol, pyridine, nitrobenzene, dinitrobenzene, p-toluidine, methylene blue, the copper salts of organic acids, such as copper acetate, and the like. The heat-polymerization inhibitor is generally added, when used, in an amount of about 0.001 to 5 parts by weight per 100 parts by weight of the monomer.

Into the photopolymerizable composition of the present invention there can further be incorporated coloring materials, a plasticizer, a resin, and other additives.

As the coloring material, pigments such as titanium oxide, carbon black, iron oxide, phthalocyanine based pigments, azo based pigments and the like, and dyes such as Methylene Blue, Crystal Violet, rhodamine B, Fuchsine, Auramine, azo based dyes and anthraquinone based dyes can be used. In particular, a coloring material or materials not absorbing light at the absorbance wave length of the photopolymerization initiator is preferred. In the case of pigments, they are usually added, when used, in an amount of about 0.1 to 30 parts by weight per 100 parts by weight of the total weight of the binder and the monomer, and in the case of dyes, they are generally added, when used, in an amount of about 0.01 to 10 parts by weight, preferably about 0.1 to 3 parts by weight, per 100 parts by weight of the total weight of the binder and the monomer.

Representative plasticizers include the following: phthalates such as dimethyl phthalate, diethyl phthalate, dibutyl phthalate, diisobutyl phthalate, dioctyl phthalate, octylcapryl phthalate, dicyclohexyl phthalate, didodecyl phthalate, butylbenzyl phthalate, diisodecyl phthalate, diallyl phthalate and the like, glycol esters such as dimethyl glycol phthalate, ethylphthalyl ethyl glycolate, methylphthalyl ethyl glycolate, butylphthalyl butyl glycolate, triethyleneglycol dicaprate and the like, phosphates such as tricresol phosphate, triphenylphosphate and the like, aliphatic dibasic acid esters such as diisobutyl adipate, dioctyl adipate, dimethyl sebacate, dibutyl sebacate, dioctyl azelate, dibutyl maleate and the like, and triethyl citrate, glycerin triacetyl ester, butyl laurate and the like.

The recording material used in the image forming method of the present invention is produced by a method (1) in which preferably 5 to 70%, most preferably 20 to 40%, of a light-sensitive composition is dissolved in a solvent to form a coating solution which is then coated on the desired support to form a light-sensitive layer, and a transparent film is laminated to the light-sensitive layer; and by a method (2) in which a light-sensitive composition is provided on a transparent film in the same manner as described above and then pressed and laminated on a support in such a manner that the light-sensitive layer is interposed between the support and the transparent film. In carrying out the lamination or contact bonding, it is preferred to heat at preferably 50° to 120° C, most preferably 70° to 100° C.

Solvents which can be used in preparing the coating solution are those which are capable of dissolving each material and have a boiling point higher than about 50° to 60° C in order to avoid clouding upon drying, and include alcohols such as methanol, ethanol, isopropanol, butanol and the like, ketones such as acetone, methyl ethyl ketone, methyl isobutyl ketone, cyclohexanone, diisobutylketone and the like, esters such as ethyl acetate, butyl acetate, n-amyl acetate, methyl formate, ethyl propionate, dimethyl phthalate, ethyl benzoate and the like, aromatic hydrocarbons such as toluene, xylene, benzene, ethylbenzene, monochlorobenzene, cresol and the like, halogenated hydrocarbons such as carbon tetrachloride, trichloroethylene, chloroform, 1,1,1-trichloroethane, monochlorobenzene, chloronaphthalene and the like, glycol derivatives such as ethylene glycol monomethyl ether, ethylene glycol monoethyl ether acetate and the like, and dimethylformamide, dimethylsulfoxide, etc. Mixtures of such solvents can be used, as desired.

Transparent films used in the present invention must illustrate good transparency to light at the light-sensitive wave length region of the light-sensitive composition and must have a uniform surface.

As the transparent film, various plastic films such as polyethylene terephthalate, polypropylene, polyethylene, cellulose triacetate, cellulose diacetate, polyvinyl chloride, polyvinyl alcohol, polycarbonate, polystyrene, cellophane, polyvinylidene chloride, polyamide, a vinyl chloride-vinyl acetate copolymer, polytetrafluoroethylene, polytrifluoroethylene and the like can be used. Moreover, composites comprising two or more of the above polymers can be used.

The term "transparent" as used herein refers to more than 70% transmittance of light at a wavelength region of from 380 m$\mu$ to 450 m$\mu$, regardless of the thickness of the film. In general, however, transparent films having a thickness of about 10 to 150 $\mu$, preferably about 20 to 50 $\mu$, are used.

In the image forming method of the present invention, it is advantageous, from the viewpoint of operating efficiency, that the light-sensitive element be previously prepared by providing a light-sensitive composition on a transparent film and the light-sensitive element be laminated on the support. Moreover, it is advantageous that a protective film be provided on the light-sensitive element, the protective film being removed just prior to use, for example, just prior to contacting the light-sensitive composition with the support.

As the protective film, in addition to the above described materials used in the transparent film, paper, polyethylene, polypropylene, a laminated paper or the like can be used. The thickness of the protective film is generally from about 8 to 80 $\mu$, preferably about 10 to 50 $\mu$. In this case, assuming that the adhesive strength between the light-polymerizable composition and the transparent film is A, and that between the light-polymerizable composition and the protective film is B, it is required that A be larger than B, that is, A>B. An exemplary listing of combinations of such materials is shown in Table 1.

Table 1

| Transparent Film | Protective Film |
| --- | --- |
| (1) Polyethylene terephthalate | Polypropylene |
| (2) Polyethylene terephthalate | Polyethylene |
| (3) Polyamide (Nylon 6) | Polyethylene |
| (4) Polyvinyl Chloride | Cellophane |
| (5) Polyimide | Polypropylene |

If the above described relationship between A and B is not met, it can be satisfied by surface-treating at least one of the support and the protective film, as well as by using combinations of different materials as shown in Table 1.

In general, surface treatment of the support is carried out for the purpose of increasing the adhesive streng between the support and the photopolymerizable composition. Examples of such surface treatments include the provision of an undercoating layer, a corona discharge treatment, a flame treatment, irradiation with ultraviolet rays, high frequency irradiation, glow discharge irradiation, active plasma irradiation, irradiation with a laser beam and the like.

On the other hand, the surface treatment of the protective film will generally be carried out for the purpose of decreasing the adhesive strength between the protective film and the light-polymerizable composition. For example, a polyorganosiloxane, fluorinated polyolefin, e.g., polyfluoroethylene, or the like can be provided as an undercoating layer to decrease adhesion.

Supports as are used herein include all of those supports hitherto used in the field of photography such as polyethylene terephthalate, cellulose triacetate or like films having a thickness of about 100 $\mu$ to 200 $\mu$, supports subjected to a matting treatment, a copper laminated plate, and a flexible copper plate for printed circuits, an aluminum plate for planographic printing, art paper, etc. The support preferably has dimensional stability and, in addition, properties which satisfy the requirements for use in the fields of photography, printed circuits, printing plates, etc.

Images formed on these supports can be used as a resist image, an image for printing, an image for color proofs, or the like.

The light-sensitive layer and the transparent film are provided, in this order, on the support to produce a laminated member, which is subjected to imagewise exposure.

As light sources for this imagewise exposure, light sources containing light of a wave length of about 350 to 450 m$\mu$, such as a high voltage mercury lamp, a xenon lamp, a carbon arc lamp, a fluorescent lamp for copying and the like, can be used. In addition, laser beams, electron beams, X-rays and the like can be used as the light source.

After the imagewise exposure, when the transparent film is removed while heating at a temperature of about 70° to 150° C, the unexposed areas of the light-sensitive layer remain on the support while the exposed areas of the light-sensitive layer are removed with the transparent film, whereby an image is formed on the support. That is, at a temperature of about 70° to 150° C at the unexposed areas the adhesive strength (A) between the support and the light-sensitive layer and the adhesive strength (B) between the transparent film and the light-sensitive layer are stronger than the cohesive force (C) of the light-sensitive layer itself, whereas at the exposed areas, the relation, A<C≦B holds. Polyvinyl butyral is a polymeric material having excellent properties satisfying the above relation.

While the recording material of the present invention can be particularly effectively used in producing resist images, it can also be used in photographic or optical reproduction, production of reliefs, production of printing plates for planographic printing and letter press printing, and the like.

The recording material of the present invention provides images of high contrast as compared with conventional recording materials. Therefore, it is excellent for the reproduction of fine patterns. Moreover, the images produced by the use of the recording material of the present invention are excellent in abrasion resistance, chemical resistance and the like, and the redording material of the present invention exhibits particularly excellent capabilities for the production of resist images.

The present invention will be explained in detail by reference to the following examples and comparison examples, although it is not limited thereby. All percents, and ratios are by weight unless otherwise indicated.

EXAMPLE 1

| Ingredients | Amount (g) |
| --- | --- |
| Polyvinyl Butyral (Eslex BLS, produced by Sekisui Kagaku Co.)* | 100 |
| Pentaerythritol Triacrylate | 60 |
| 1-Methyl-2-benzoylmethylene-$\beta$-naphthothiazoline | 4.5 |
| Copper Phthalocyanine Pigment | 5 |
| Hydroquinone Monomethyl Ether | 1.2 |

*Degree of butyralation: not less than 70 mole%, mixed solvent of ethanol/toluene = 1/1 is used: 10% solution, viscosity at 20° C: 30 cps; having a molecular weight of about 150,000.

These ingredients were dissolved in 300 ml of methylene chloride to produce a light-sensitive solution. A portion of this light-sensitive solution was coated on a 25 μ thick polyethylene terephthalate film with a coating rod and then dried at 100° C for 10 minutes. The thickness of the light-sensitive layer after drying was 25 μ.

The thus prepared film was pressed and laminated onto a copper support for printed circuit formation at 80° C such that the light-sensitive layer came in contact with the copper support, the surface of the copper support having been thoroughly cleaned prior to lamination. The plate was then exposed imagewise to light through a positive photomask having a wiring pattern using a super high voltage mercury light source (2,000 W) for 1 minute.

The plate was then immediately placed in a drying machine at 120° C. After being allowed to dry for 2 minutes, the plate was removed, and the polyethylene terephthalate film was peeled off before it cooled, whereby a positive image comprising uncured (unhardened) areas was formed (thickness: 18 to 20 μ) on the copper support.

The light-cured (hardened) areas (thickness: about 25 μ) and a part of the uncured areas (thickness: about 5 μ) stuck to the polyethylene terephthalate film and were removed.

COMPARISON EXAMPLE 1

The same processing as was used in Example 1 was conducted using the same composition as was used in Example 1 except that polymethyl methacrylate (Sumipex-B-LG, produced by Sumitomo Chemical Industry Co., melt viscosity: 1.75 kilopoise at 240° C). In this case, it was impossible to form a positive image on the copper support by heat-treatment at 120° C for 2 minutes, and all of the resist layer remained on the copper support.

Taking into account the fact that the softening point of polymethyl methacrylate is higher than that of polyvinyl butyral, the polyethylene terephthalate film was peeled off after heating at a temperature of 130° C for 2 minutes or 5 minutes and at a temperature of 150° C for 2 minutes or 5 minutes. In all of these cases, no image as obtained by the use of polymethyl methacrylate.

EXAMPLE 2

| Ingredients | Amount (g) |
|---|---|
| Polyvinyl Butyral (Eslex BM-S, produced by Sekisui Kagaku Co.)* | 70 |
| Pentaerythritol Trimethacrylate | 45 |
| 1-Ethyl-2-benzoylmethylene-S-naphthothiazoline | 1.5 |
| Copper Phthalocyanine Pigment | 1.3 |
| Silicon Dioxide Powder (average particle size: 4 μ) | 2.0 |
| Hydroquinone Monomethyl Ether | 0.45 |

*Degree of butyralation: not less than 70 mole %; 10% solution in a mixed solvent of ethanol/toluene = 1/1; viscosity at 20° C: 120 cps; having a molecular weight of about 500,000.

The above ingredients were dissolved in 350 ml of methylene chloride to produce a light-sensitive solution. A portion of this solution was coated on a 25 μ thick polyethylene terephthalate film with a coating rod and dried in a drying machine at 80° C for 10 minutes. The thickness of the light-sensitive layer thus formed after drying was 20 μ.

This light-sensitive layer was laminated onto a cleaned copper support in the same manner as in Example 1, and was exposed to light. The plate was then immediately placed in a drying machine at 120° C for 3 minutes, and as soon as the plate was removed therefrom the polyethylene terephthalate film was peeled off.

As a result, a positive image comprising uncured areas was obtained on the copper support. The thickness of the image was about 15 μ. Light-cured areas (about 18 μ thick) and a part of the uncured areas stuck to the polyethylene terephthalate film and were removed.

The uncured areas formed by the light-sensitive layer were resistant to etching with an aqueous solution of ferric chloride (40° C, 40 Be).

COMPARISON EXAMPLE 2

The procedure of Example 2 was repeated except that cellulose acetate butyrate (EAB-381.20, produced by Eastman Kodak Co., 38% butyralation, 12% acetylation, 50% hydroxyl groups; having a molecular weight of about 300,000) was used in place of polyvinyl butyral. In this case, the light-sensitive layer obtained was harder than that obtained in the case of polyvinyl butyral, and it was impossible to form an image under the same conditions as used in Example 2.

The heating temperature at the time of peeling off the polyethylene terephthalate film was increased to 130° C or 140° C, and immediately after heating at these temperatures for 3 minutes, the polyethylene terephthalate film was peeled off. However, no effect due to increasing the heating temperature was observed, and there was detected no difference between cured and uncured areas.

Furthermore, the same processing as was used in Example 2 was conducted except that the ratio of cellulose acetate butyrate to pentaerythritol, 70 parts to 45 parts, was changed to 60 parts/45 parts or 50 parts/45 parts. It was still impossible to form an image.

EXAMPLE 3

| Ingredients | Amount (g) |
|---|---|
| Polyvinyl Butyral (Denka Butyral #3000-2, produced by Denki Kagaku Kogyo Co.)* | 158 |
| Pentaerythritol Triacrylate | 90 |
| 1-Methyl-2-benzoylmethylene-β-naphthothiazoline | 5.4 |
| Copper Phthalocyanine Pigment | 9.0 |
| Hydroquinone | 0.9 |

*Degree of butyralation: not less than 75%; 10% solution in a mixed solvent of ethanol/toluene = 1/1; viscosity at 20° C: 80 cps These ingredients were dissolved in 500 ml of methylene chloride to produce a light-sensitive solution. The same test as was used in Example 1 was conducted using the solution as obtained above, and, as a result, a satisfactory image was formed on the copper support.

When this image was treated with 40 Be ferric chloride solution at a temperature of 40° C, it was found that it had sufficient resistance to etching.

COMPARISON EXAMPLE 3

In Example 3, 2-tert-butylanthraquinone or benzoin methyl ether was used in place of 1-methyl-2-benzoylmethylene-β-naphthothiazoline to compare the effect of the sensitizers. Sensitivity was measured as the number of step wedges for step wise exposure, and the results obtained are shown, the table below.

|  | Exposure Time | |
|---|---|---|
|  | 30 seconds (steps) | 60 seconds (steps) |
| (1) 1-Methyl-2-benzoylmethylene-β-naphthothiazoline | 10 | 12 |
| (2) 2-tert-Butylanthraquinone | 7 | 9 |
| (3) Benzoin Methyl Ether | 5 | 7 |
| Light source used: | super high voltage mercury lamp (2 KW), Jet Printer-2000, produced by Oku Seisaku Jo | |
| Step wedge: | density difference: 0.5; 15 steps; higher steps have higher optical density | |

As can be understood from the above results, the sensitizing effect of Compound (1) was markedly high, and thus it is possible to shorten the exposure time by a corresponding time. In the case of Compounds (2) and (3), a good image could not be obtained with one minute exposure, and in the case of Compound (2), exposure for about 2 minutes was required. In the case of Compound (3), a good image could not be obtained even if the exposure time was lengthened to 2, 3, or 5 minutes.

EXAMPLE 4

| Ingredients | Amount (g) |
|---|---|
| Polyvinyl Butyral* | 100 |
| Trimethylolpropane Triacrylate | 64 |
| 2-Methylanthraquinone | 3 |
| Copper Phthalocyanine Pigment | 1.5 |
| P-Methoxyphenol | 1.2 |

*The same as in Example 2

The above ingredients were dissolved in 450 ml of toluol to produce a light-sensitive solution. A portion of this solution was coated onto a polyethylene terephthalate film and dried at 100° C for 15 minutes. The thickness of the light-sensitive layer thus formed after drying was 5 μm.

This light-sensitive layer was laminated onto an aluminum plate for printing plate formation by pressing.

The thus obtained plate was imagewise exposed to light through a positive original having a printing pattern using a PS light-S type (metal hydride lamp: 2 KW, produced by Fuji Photo Film Co., Ltd.) at a distance of 1 m for 42 seconds. The plate was then immediately dried at 120° C. After drying for 3 minutes, the plate was removed, and the polyethylene terephthalate film peeled off, whereby a positive image comprising the unhardened areas was formed on the aluminum plate.

The thus obtained planographic printing plate was subjected to gum treatment with an aqueous gum arabic solution and was mounted on a printing press and off-set printing conducted to obtain more than 2,500 copies.

Since printing plates are less durable when unhardened areas are used as image areas, a printing plate formed as above was also subjected to overall exposure of the plate to harden the image areas thereon. As a result, more than 20,000 copies were obtained.

EXAMPLE 5

| Ingredients | Amount (g) |
|---|---|
| Polyvinyl Butyral* | 100 |
| Diglycerine Trimethacrylate | 71 |
| 1-Methyl-2-benzoylmethyl-β-naphthothiazoline | 1.2 |
| Ethyl Violet | 0.1 |
| Triphenyl Phosphate | 3 |
| Hydroquinone | 1.0 |

*The same as in Example 2

The above ingredients were dissolved in 400 ml of methyl ethyl ketone to produce a light-sensitive solution. The procedure of Example 4 was then repeated except that the thickness of the light-sensitive layer formed after drying was 4 μm. As a result, more than 2,000 copies were obtained, and upon overall exposure of the plate to harden the image areas thereon, more than 10,000 copies were obtained.

While the invention has been described in detail and with reference to specific embodiments thereof, it will be apparent to one skilled in the art that various changes and modifications can be made therein without departing from the spirit and scope thereof.

What is claimed is:

1. A process for forming an image which comprises imagewise exposing a recording material comprising a support, a light-sensitive composition layer on said support, and a transparent film on said light-sensitive composition layer, and then peeling off said transparent film to remove the exposed areas of said light-sensitive composition layer with said transparent film and to leave the unexposed areas of said light-sensitive composition layer on said support, thereby to form an image on said support, wherein said light-sensitive composition comprises:
   a. a monomer containing at least two addition-polymerizable unsaturated bonds and having a boiling point of at least 100° C,
   b. polyvinyl butyral, and
   c. a photopolymerization initiator represented by the formula:

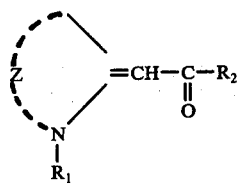

wherein $R_1$ is an alkyl group or vinylmethyl group, $R_2$ is an alkyl group, aryl group or thienyl group, and Z is a group of non-metallic atoms necessary to forming a heterocyclic ring, and said transparent film is peeled off at a temperature of about 70° to 150° C.

2. The process according to claim 1, wherein the monomer contains two or more different addition-polymerizable unsaturated bonds.

3. The process according to claim 1, wherein the polyvinyl butyral has a molecular weight of about 10,000 to 1,000,000 and a degree of butyralation of about 58 to 75 mole %.

4. The process according to claim 3, wherein the polyvinyl butyral has a molecular weight of about 20,000 to 100,000 and a degree of butyralation of about 70 to 75 mole %.

5. The process according to claim 1, wherein the photopolymerization initiator is selected from the group consisting of 2-benzoylmethylene-3-methyl-β-naphthothiazoline, 2-benzoylmethylene-3-ethyl-β-naphthothiazoline, 3-ethyl-2-(2-thenoyl)methylene-β-naphthothiazoline, 3-ethyl-2-propionylmethylene-β-naphthothiazoline, and 5-chloro-3-ethyl-2-p-methoxybenzoylmethylenebenzothiazoline.

6. The process according to claim 1, wherein the polyvinyl butyral is present in an amount of about 50 to 300 parts by weight per 100 parts by weight of the monomer.

7. The process according to claim 6, wherein the polyvinyl butyral is present in an amount of about 100 to 200 parts by weight per 100 parts by weight of the monomer.

8. The process according to claim 1, wherein the photopolymerization initiator is present in an amount of about 0.1 to 20 parts by weight per 100 parts by weight of the monomer.

9. The process of according to claim 1, wherein $R_1$ is an unsubstituted lower alkyl group.

10. The process of according to claim 1, wherein $R_1$ is a hydroxyalkyl group, an alkoxyalkyl group, a carboxyalkyl group, a sulfoalkyl group, or an aralkyl group.

11. The process according to claim 1, wherein $R_2$ is a lower alkyl group.

12. The process according to claim 1, wherein $R_2$ is an aryl group.

13. The process according to claim 1, wherein $R_2$ is a thienyl group.

14. The process according to claim 1, wherein Z forms a nitrogen-containing heterocyclic nucleus.

15. The process according to claim 1, wherein Z forms a 5-membered nitrogen-containing heterocyclic nucleus which is fused with a system containing 6-membered rings.

16. The process according to claim 1, wherein Z forms a nucleus selected from the group consisting of a benzothiazole, a naphthothiazole, a benzoselenazole, a naphthoselenazole, a benzooxazole and a naphthooxazole nucleus.

17. The process according to claim 1, wherein said transparent film has a transparency greater than 70% to light in the region 380 m$\mu$ to 450 m$\mu$.

18. The process according to claim 17, wherein said transparent film has a thickness of about 10 to 150 $\mu$.

* * * * *